(12) United States Patent
Otagaki et al.

(10) Patent No.: US 10,175,838 B2
(45) Date of Patent: Jan. 8, 2019

(54) METHODS AND APPARATUS FOR A TOUCH SENSOR

(71) Applicant: SEMICONDUCTOR COMPONENTS INDUSTRIES, LLC, Phoenix, AZ (US)

(72) Inventors: Takayasu Otagaki, Ota (JP); Kazuyoshi Ishikawa, Oizumi-machi (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 32 days.

(21) Appl. No.: 15/402,379

(22) Filed: Jan. 10, 2017

(65) Prior Publication Data

US 2018/0196543 A1 Jul. 12, 2018

(51) Int. Cl.
*G06F 3/044* (2006.01)
*G06F 3/041* (2006.01)
*H01L 27/32* (2006.01)
*G02F 1/1333* (2006.01)
*H01L 51/52* (2006.01)
*G02F 1/1343* (2006.01)

(52) U.S. Cl.
CPC .......... *G06F 3/044* (2013.01); *G02F 1/13338* (2013.01); *G06F 3/041* (2013.01); *G06F 3/0416* (2013.01); *H01L 27/323* (2013.01); *H01L 51/5203* (2013.01); *G02F 1/1343* (2013.01); *G02F 1/134309* (2013.01); *G06F 2203/04103* (2013.01); *G06F 2203/04111* (2013.01); *G09G 2300/0426* (2013.01)

(58) Field of Classification Search
CPC .......... G06F 3/044; G06F 3/041; G06F 3/047; G06F 3/0412; G06F 3/0416; G06F 2203/04111; G06F 2203/04112; H01L 27/323; H01L 27/124; H01L 27/3276; H01L 51/5203; G02F 1/13338; G02F 1/134309; G02F 1/1343; G09G 2300/0426; G09G 3/3225
See application file for complete search history.

(56) References Cited

U.S. PATENT DOCUMENTS

| 7,859,521 | B2 * | 12/2010 | Hotelling | G06F 3/0412 |
| | | | | 345/173 |
| 8,902,189 | B2 * | 12/2014 | Park | G06F 3/047 |
| | | | | 257/72 |
| 9,274,662 | B2 * | 3/2016 | Schwartz | G06F 3/044 |
| 9,389,719 | B2 * | 7/2016 | Li | G06F 3/0412 |
| 9,405,408 | B2 * | 8/2016 | Peng | G06F 3/044 |

(Continued)

*Primary Examiner* — Dismery Mercedes
(74) *Attorney, Agent, or Firm* — The Noblitt Group, PLLC; Hettie L. Haines (57) ABSTRACT

Various embodiments of the present technology may comprise methods and apparatus for a touch sensor. The touch sensor may comprise an array of sensor cells, wherein each cell comprises two reception electrodes. Each reception electrode may comprise two portions arranged diagonally, wherein a first reception electrode is arranged along one diagonal and a second reception electrode is arranged along a second diagonal, such that the two reception electrodes overlap in a center portion of the cell. The touch sensor may further comprise a drive electrode arranged in a grid pattern throughout the array to surround each sensor cell.

20 Claims, 9 Drawing Sheets

(56) References Cited

U.S. PATENT DOCUMENTS

| | | | | |
|---|---|---|---|---|
| 9,417,747 | B2* | 8/2016 | Yumoto | G06F 3/044 |
| 9,496,097 | B2* | 11/2016 | Lee | H01H 1/06 |
| 9,678,594 | B2* | 6/2017 | Wang | G02F 1/13 |
| 9,684,419 | B2* | 6/2017 | Han | G06F 3/044 |
| 9,904,424 | B2* | 2/2018 | Lee | G06F 3/044 |
| 2008/0218488 | A1* | 9/2008 | Yang | G09G 3/20 |
| | | | | 345/173 |
| 2009/0066665 | A1 | 3/2009 | Lee | |
| 2010/0171723 | A1 | 7/2010 | Kobayashi | |
| 2015/0002464 | A1* | 1/2015 | Nishioka | G06F 3/044 |
| | | | | 345/174 |
| 2015/0277639 | A1* | 10/2015 | Li | G06F 3/0412 |
| | | | | 345/173 |
| 2016/0041663 | A1* | 2/2016 | Chen | G06F 3/0412 |
| | | | | 345/174 |
| 2016/0334660 | A1* | 11/2016 | Lin | G02F 1/13338 |
| 2017/0160866 | A1* | 6/2017 | Tsai | G06F 3/0416 |
| 2017/0192508 | A1* | 7/2017 | Lim | G06F 3/016 |
| 2017/0344146 | A1* | 11/2017 | Sun | G06F 3/044 |

\* cited by examiner

METHODS AND APPARATUS FOR A TOUCH SENSOR

BACKGROUND OF THE TECHNOLOGY

Capacitive sensors operate by detecting changes in the capacitance formed between a transmission electrode and a sense electrode. A sensing circuit can recognize an object and determine the location, pressure, direction, gestures, speed and acceleration of the object as it is approaches and/or moves across the touch surface.

Electronic devices with touch sensing surfaces may utilize various capacitive sensing devices to allow a user to make selections and move objects by moving their finger (or stylus) relative to a capacitive sensing element. Mutual capacitance touch sensors not only have the ability to detect touch events on the sensing surface, but also have the ability to detect proximity events, in which an object is not touching the sensing surface, but is in close proximity to the sensing surface. The mutual capacitive touch sensor operates by measuring the capacitance of the capacitive sense element, and detecting a change in capacitance indicating a touch or presence of a conductive object. When the conductive object (e.g., a finger, hand, foot, or other object) comes into contact or close proximity with a capacitive sense element, the capacitance changes and the conductive object is detected. An electrical circuit may be utilized to measure the change in capacitance of the capacitive touch sense element, and the electrical circuit may convert the measured capacitance of the capacitive sense element into a digital value.

SUMMARY OF THE INVENTION

Various embodiments of the present technology may comprise methods and apparatus for a touch sensor. The touch sensor may comprise an array of sensor cells, wherein each cell comprises two reception electrodes. Each reception electrode may comprise two portions arranged diagonally, wherein a first reception electrode is arranged along one diagonal and a second reception electrode is arranged along a second diagonal, such that the two reception electrodes overlap in a center portion of the cell. The touch sensor may further comprise a drive electrode arranged in a grid pattern throughout the array to surround each sensor cell.

BRIEF DESCRIPTION OF THE DRAWINGS

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and circuit diagrams. Such functional blocks and circuit diagrams may be realized by any number of components configured to perform the specified functions and achieve the various results. For example, the present technology may employ various types of analog-to-digital converters, capacitors, amplifiers, power sources, and the like, which may carry out a variety of functions. The methods and apparatus for a capacitive touch sensor according to various aspects of the present technology may operate in conjunction with any electronic device and/or device input application, such as a cellular phone, an audio device, a gaming device, a television, a personal computer, and the like.

Referring to FIGS. 1A-B, 2, and 3, in various embodiments of the present technology, a touch sensor 100 may detect an object by measuring a change in a capacitance and/or a digital output of the sensor 100. For example, the touch sensor 100 may produce an electric field 125 and respond to objects entering and/or within the electric field 125. The touch sensor 100 may operate as a proximity sensor to detect an object within the electric field 125. For example, the touch sensor 100 may generate the electric field 125 at a surface of the touch sensor 100 to detect an object 120, such as a human fingertip, a pen point or the like, when the object 120 enters the electric field 125. As such, the object 120 may not need to physically touch the touch sensor 100 to effect a change in the capacitance.

Figure 1A:
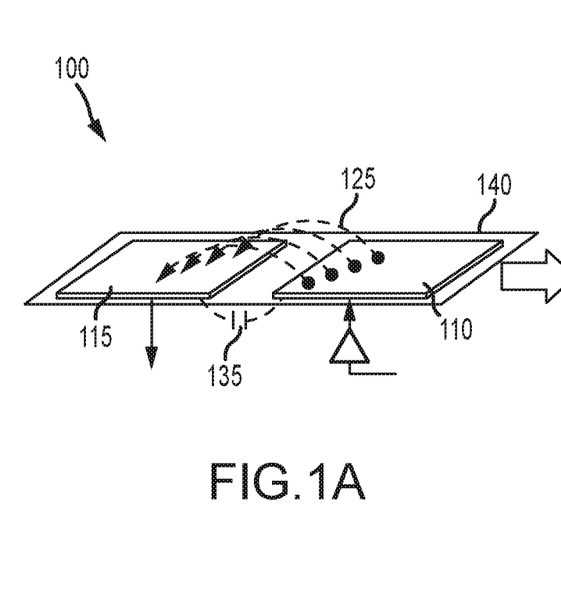
FIGS. 1A and 1B representatively illustrate a mutual capacitance touch sensor in accordance with an exemplary embodiment of the present technology.
Figure 1B:
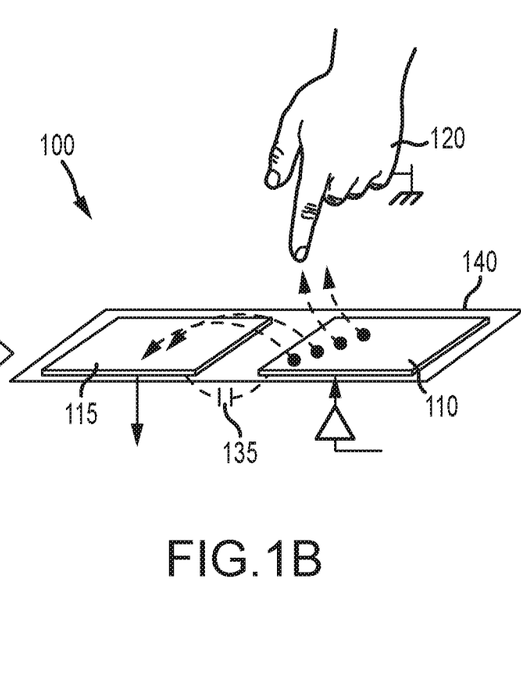

The touch sensor 100 may comprise any suitable device or system responsive to the electric field 125, such as a microprocessor 400. The touch sensor 100 may form various input devices, such as buttons, switches, dials, sliders, keys or keypads, navigation pads, touch pad may be integrated in an electronic device, such as a cellular phone, personal computer, and the like.

In various embodiments, the touch sensor 100 may comprise a mutual capacitance sensor. For example, the touch sensor 100 may comprise a plurality of electrodes suitably configured to form a sense capacitor 135 and create the electric field 125. For example, the electrodes may be formed using a conductive material, such as metal. In various embodiments, at least one electrode may comprise a drive electrode 110 and at least one electrode may comprise a reception electrode 115, wherein the drive electrode 110 and the reception electrode 115 are capable of creating the electric field 125. In various embodiments, the drive electrode 110 may be coupled to a power source 210 that pulses between two voltage levels to provide a drive signal Cdrv.

The touch sensor 100 may comprise a substrate 140 for providing a material on which the reception electrode 115 and drive electrode 110 are formed. For example, the substrate 140 may comprise any suitable material for depositing, forming, and/or inscribing a circuit, such as glass coated with indium tin oxide, a PET (polyethylene terephthalate) substrate, a polymer film, a PCB substrate, and the like. In various embodiments, the substrate 140 may comprise one or more substrate layers.

In various embodiments, the drive electrode 110 and the reception electrode 115 may be coplanar. For example, the drive electrode 110 and the reception electrode 115 may be formed on the same substrate layer. In alternative embodiments, the drive electrode 110 may be formed on one substrate layer, while the reception electrode 115 may be formed on a different substrate layer.

Figure 2:
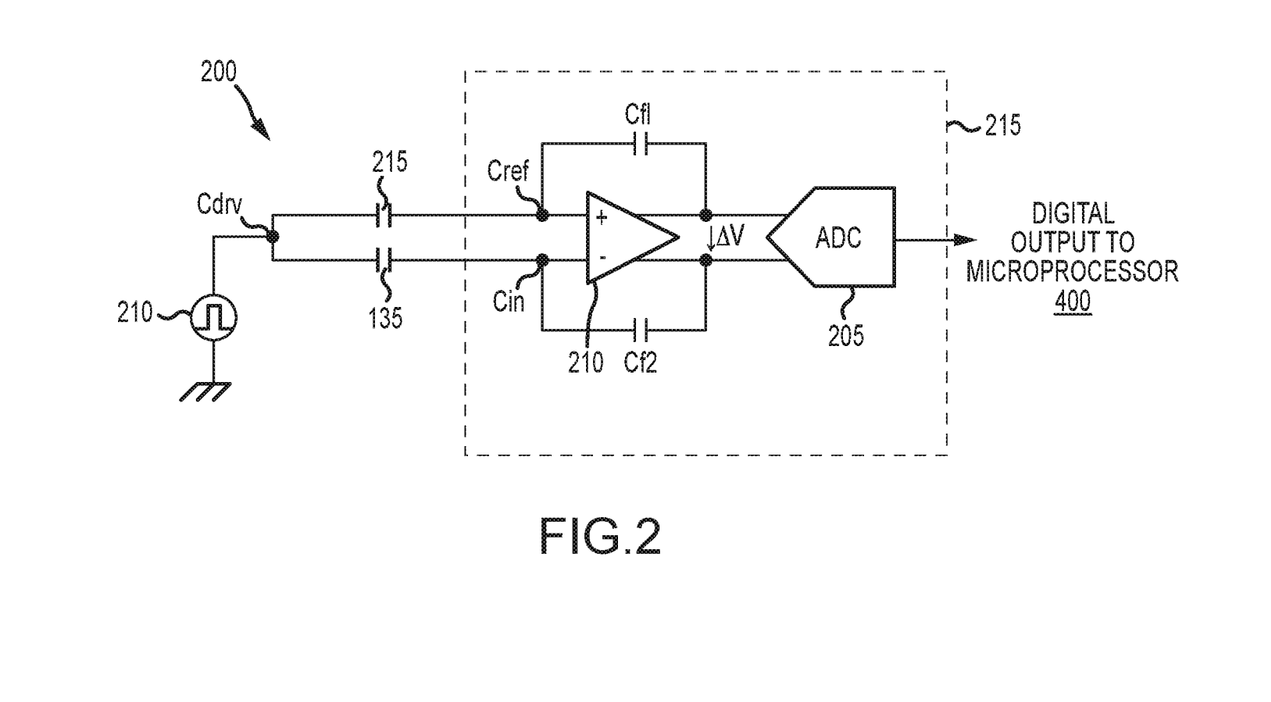
FIG. 2 is an equivalent circuit diagram of a capacitive touch sensor in accordance with an exemplary embodiment of the present technology.
Figure 3:
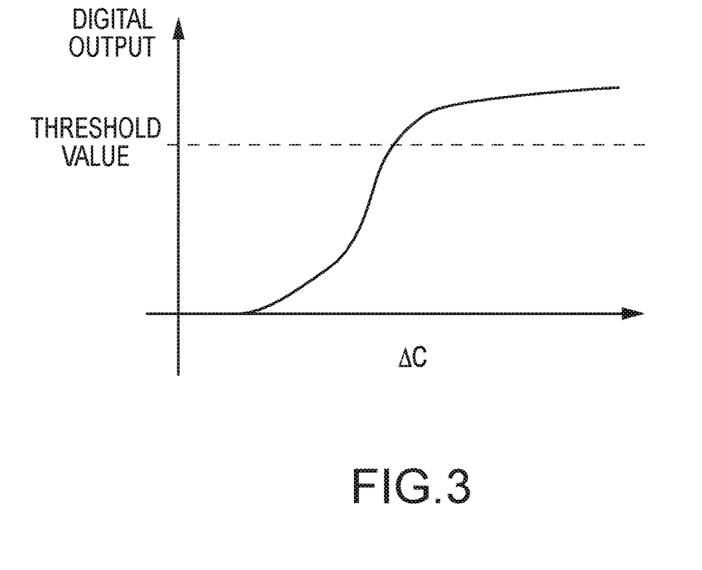
FIG. 3 graphically illustrates a relationship between a change in capacitance and a digital output in accordance with an exemplary embodiment of the present technology.

In various embodiments, the touch sensor 100 may detect the object 120 by measuring and/or detecting capacitance changes between the reception electrode 115 and the drive electrode 110. The touch sensor 100 may comprise a conversion circuit 215 to convert the change in capacitance to a digital output.

In various embodiments, the conversion circuit 215 may convert the change in capacitance to a change in voltage and then convert the voltage into the digital output. For example, the conversion circuit 215 may comprise a fully differential amplifier 210 to convert the change in capacitance to a change in voltage, and an analog-to-digital converter 205 to convert the change in voltage to the digital output. The fully differential amplifier 210 may receive a first input from a reference capacitor 215 with a resting capacitance C and a second input from the sensing capacitor 135, wherein the sensing capacitor 135 has a sensing capacitance C'. The sensing capacitance C' is equal to the resting capacitance C when there are no objects absorbing the electric field 125, however, the sensing capacitance C' is equal to the resting capacitance minus the change in the capacitance (C'=C−ΔC) when the object enters the electric field 125. The fully differential amplifier 210 may further comprise a feedback capacitor to reduce noise in the signals. In an exemplary embodiment, the fully differential amplifier comprises a first feedback capacitor Cf1 coupled between an output terminal and the non-inverting terminal (+) of the differential amplifier 200, and a second feedback capacitor Cf2 coupled between the output terminal and the inverting terminal (−) of the differential amplifier 200. As such, the fully differential amplifier 200 receives a reference capacitance Cref corresponding to the first feedback capacitor Cf1 and the resting capacitance C, and an input capacitance Cin corresponding to the second feedback capacitor Cf2 and the sensing capacitance C' as inputs.

In general, and referring to FIGS. 1A, 1B, and 2, as the object 120 approaches, such as when a person's finger gets close to the touch sensor 100 some of the electric field 125 is absorbed by the object 120, decreasing the amount of energy detected by the touch sensor 100 and reducing the capacitance. As the object 120 gets closer to the surface of the touch sensor 100, more of the electric field 125 is absorbed by the object 120 and the capacitance may continue to decrease, causing the output voltage and the digital output to increase. As the digital output changes according to the amount of energy detected by the touch sensor 100, it may be possible to quantify or otherwise estimate the distance between the object 120 and the surface of the touch sensor 100.

In various embodiments, the touch sensor 100 may detect when the digital output reaches and/or exceeds a predetermined threshold value according to a change the in the capacitance (ΔC). For example, and referring to FIG. 3, as the change in capacitance increases, the digital output also increases. The touch sensor 100 may respond once the digital signal reaches and/or exceeds the predetermined threshold value. For example, the touch sensor 100 may transmit a signal to an output circuit (not shown) to switch states between ON and OFF, which may indicate some input selection of an electronic device, such as a cellular phone.

Referring to FIGS. 4A-C, 6, and 7, in an exemplary embodiment, the touch sensor 100 may be configured to detect single inputs, multiple inputs, and gestures, such as rotating, scrolling, flicking, scaling, dragging, and the like. The touch sensor may comprise multiple electrodes arranged to form multiple mutual capacitance-type capacitors.

Figure 6:
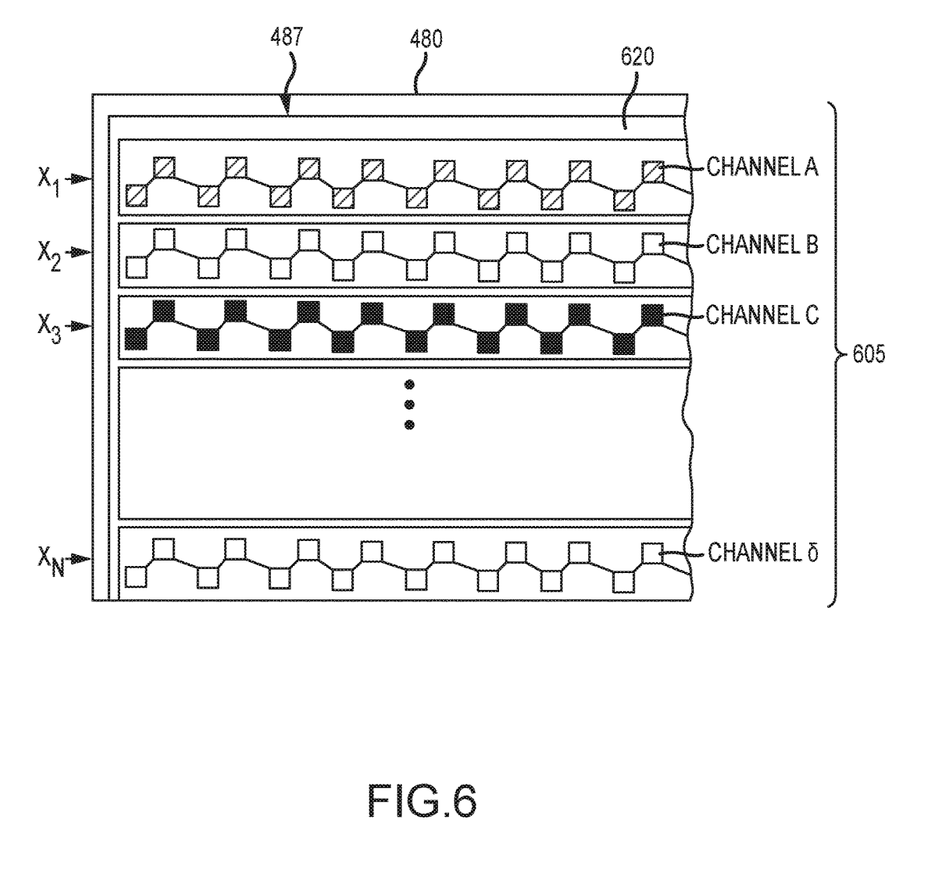
FIG. 6 representatively illustrates electrodes formed along an x-direction of a substrate in accordance with an exemplary embodiment of the present technology.
Figure 7:
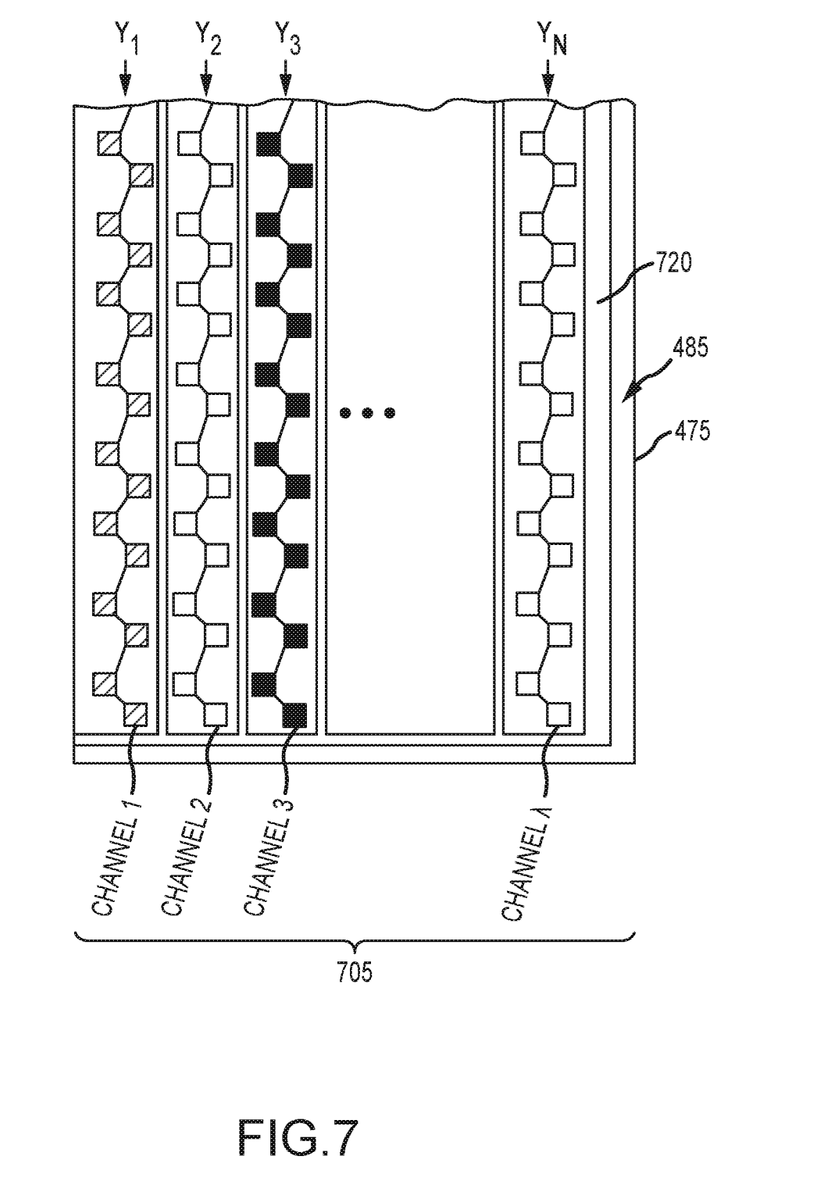
FIG. 7 representatively illustrates electrodes formed along a y-direction of the substrate in accordance with an exemplary embodiment of the present technology.

The touch sensor 100 may comprise an electrode chain that operates as a reception electrode 115 (FIG. 1) in conjunction with the drive electrode 110 to form the sense capacitor. In an exemplary embodiment, the touch sensor 100 may comprise a plurality of first electrode chains 705 (e.g., channel 1:channel λ) arranged along a first direction (e.g., the y-direction), and a plurality of second electrode chains 605 (e.g., channel A:channel δ) arranged along a second direction (e.g., the x-direction), wherein the second direction is perpendicular to the first direction. Each individual electrode chain may be identified by a particular channel name, for example channel 1, channel A, etc. The first and second electrode chains may be arranged symmetrically across the touch sensor 100. For example, the plurality of first electrode chains 705 may be arranged such that adjacent first electrode chains are equidistance from each other. Similarly, the plurality of second electrode chains 605 may be arranged such that adjacent second electrode chains are equidistance from each other.

The plurality of first and second electrode chains 705, 605 may be arranged in the substrate 140 in any suitable manner. For example, in one embodiment, each channel of the first electrode chains may be arranged in a zigzag pattern from a first edge of the touch sensor 100 to an opposing second edge of the touch sensor 100. Similarly, each channel of the second electrode chains 605 may be positioned substantially perpendicular to the first electrode chains 705 and arranged in a zigzag pattern extending from a third edge of the touch sensor 100 to an opposing fourth edge of the touch sensor 100.

Figure 4A:
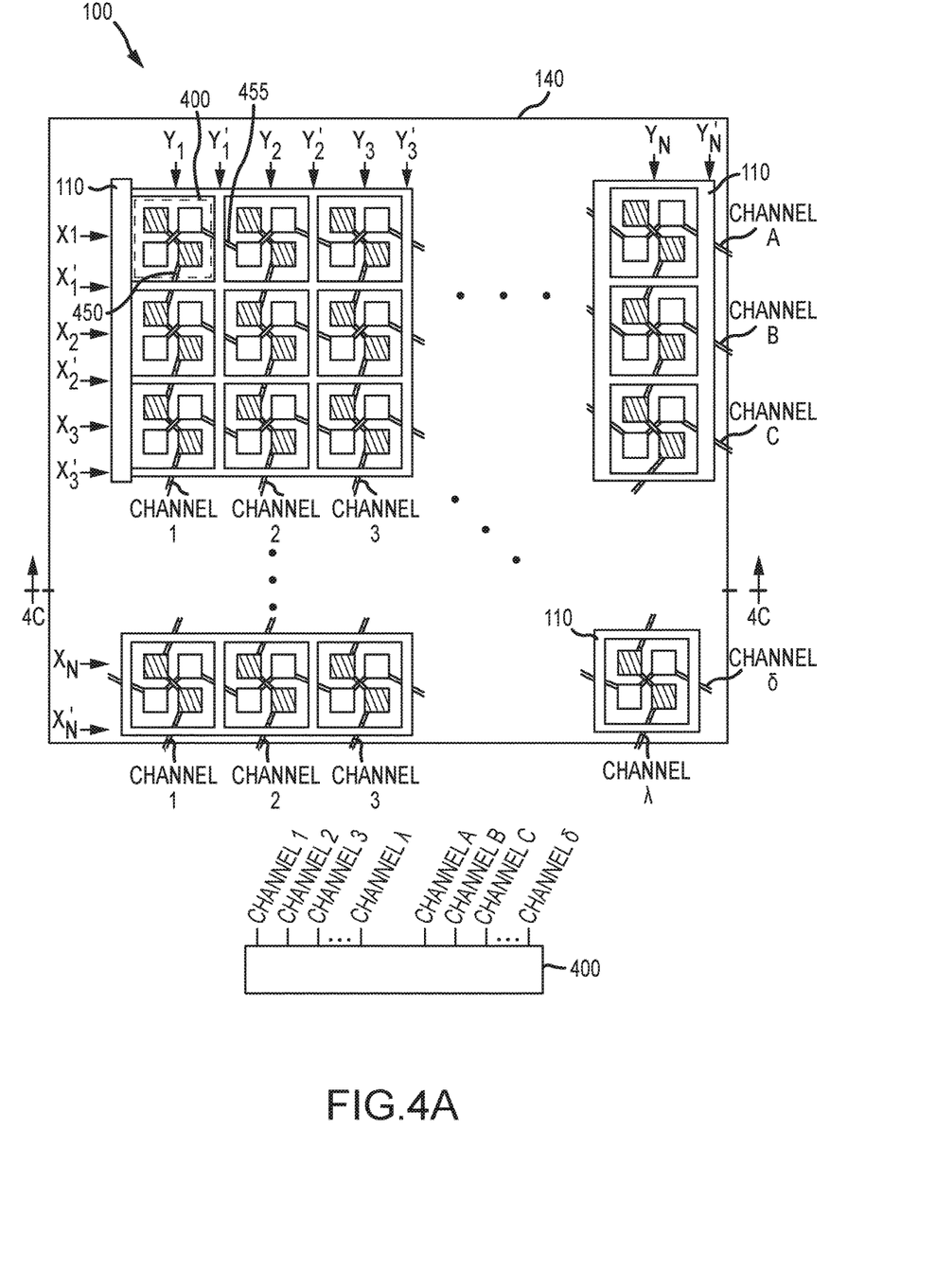
FIGS. 4A-4C representatively illustrate a touch sensor in accordance with an exemplary embodiment of the present technology.

The plurality of first and second electrode chains 480, 705 may be configured to be positioned within the layers of the substrate 140. For example, in an exemplary embodiment, the substrate 140 may comprise a first substrate layer 475 and a second substrate layer 480. For example, the first substrate layer 475 may comprise the plurality of first electrode chains 705. The first substrate layer 475 may comprise a first major surface 485 and a second major surface 486 opposite that of the first major surface 485. Similarly, the second substrate layer 480 may comprise the plurality of second electrode chains 605. The second substrate layer 480 may comprise a first major surface 487 and a second major surface 488 opposite that of the first major surface 487.

The substrate 140 may further comprise the drive electrode 110. Each substrate layer may further comprise a segment of the drive electrode 110. For example, the first substrate layer 475 may comprise a first drive electrode segment 720, wherein the first drive electrode segment 720 may be formed along an outer edge of the first substrate layer 475 and between adjacent electrode chains, such as channel λ-2 and channel λ-1. Similarly, the second substrate layer 480 may comprise a second drive electrode segment 620, wherein the second drive electrode segment 620 may be formed along an edge of the second substrate layer 480 and between adjacent electrode chains, such as channel A and channel B.

The first and second substrate layers 475, 480 may be bonded together, such that the major surfaces of the first substrate layer 475 are parallel to the major surfaces of the second substrate layer 480. The first and second electrode chains 705, 605 may be electrically isolated from each other, however the drive electrodes segments 720, 620 within each of the first and second substrate layers 475, 480 may be coupled to one power source 210 and considered as one drive electrode, and may be referred to, collectively, as the drive electrode 110.

In various embodiments, the touch sensor 100 may comprise a plurality of cells 400 arranged in an array as a result of bonding the first and second substrate layers 475, 480 together. The array may comprise n columns and m rows, where n and m are whole numbers, to form an m×n array having m×n cells 400. The location of each cell 400 may be described according to a coordinate system having row numbers (e.g., $x_1:x_N$ along the x-direction) and column numbers (e.g., $y_1:y_N$ along the y-direction). For example, the coordinate $x_1$, $y_3$ corresponds to the cell at the third column on the first row.

The drive electrode segments 720, 620 may overlap to form the drive electrode 110. In an exemplary embodiment, the drive electrode 110 may be arranged in a grid pattern forming an area such that each cell 400 is bounded on each side (i.e., along the perimeter) by the drive electrode 110. The drive electrode 110 may be coupled to the power source 210, as described above.

Figure 4B:
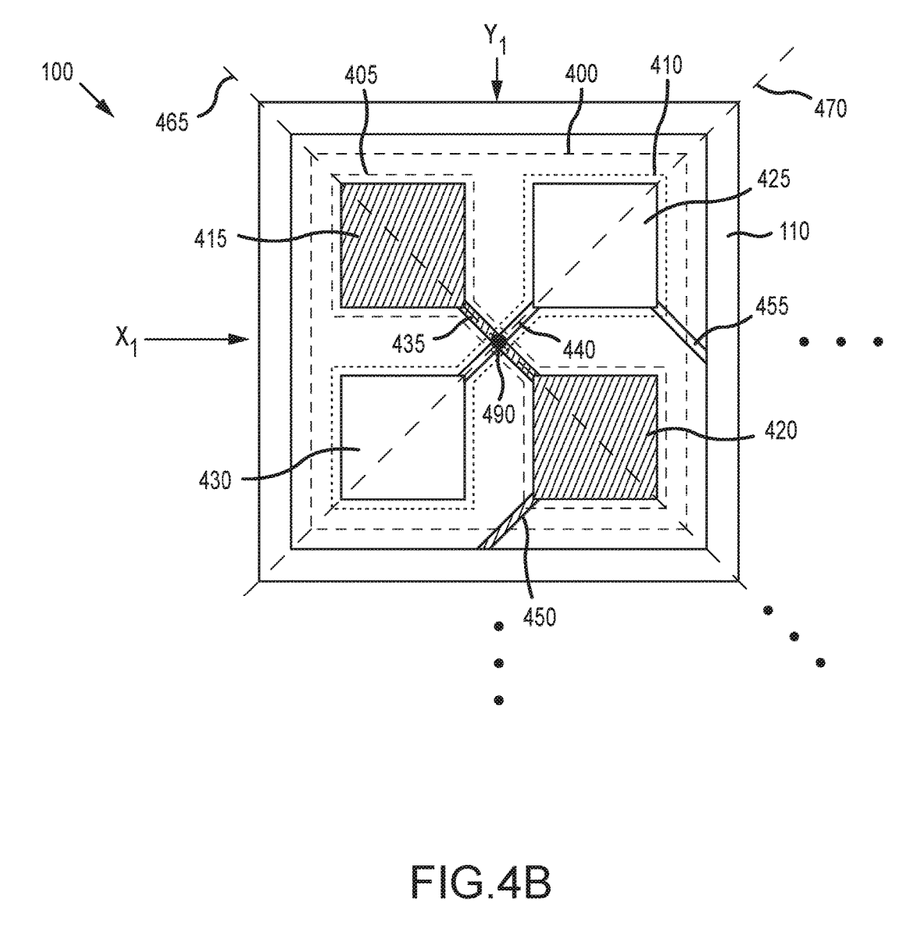
Figure 4C:
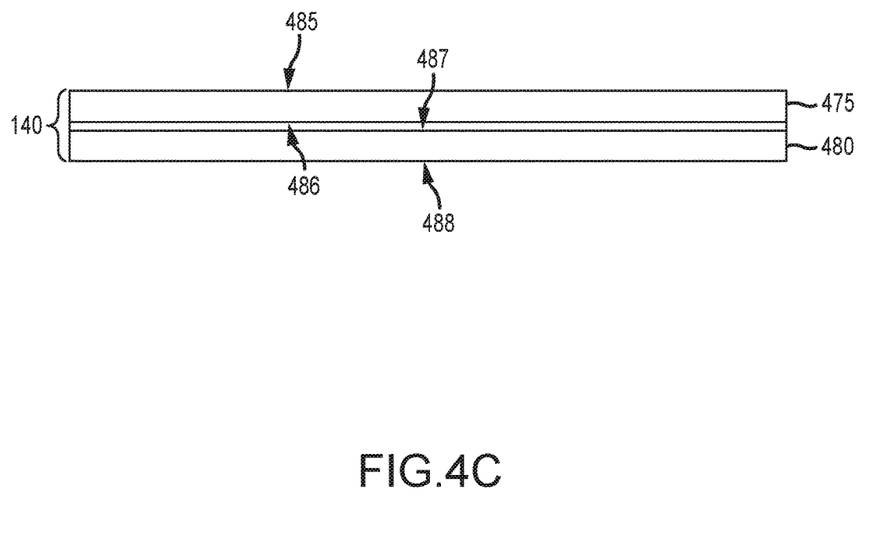

Referring now to FIG. 4B, each cell 400 may comprise fragments of the first and second electrode chains 705, 605. For example, the cell 400 may comprise a first reception electrode 405 and a second reception electrode 410, wherein the first reception electrode 405 is a fragment of one of the first electrode chains and the second reception electrode 410 is a fragment of one of the second electrode chains. In various embodiments, the first and second reception electrodes 405, 410 may be arranged diagonally within a substantially square-shaped cell 400. For example, the first reception electrode 405 may be arranged within the cell 400 along a first diagonal 465 of the square and the second reception electrode 410 may be arranged along a second diagonal 470 of the square such that the first and second reception electrodes 405, 410 overlap at a center point 490 of the cell 400. In alternative embodiments where the cell 400 is a shape other than square-shaped, such as circular, hexagonal, and the like, the first and second reception electrodes 405, 410 may overlap at the center point 490 of the cell 400 and may be arranged perpendicular to each other. The first and second reception electrodes 405, 410 may be electrically isolated from each other by an insulating material, such as an oxide.

In various embodiments, a reception electrode of one cell may be electrically coupled to a reception electrode of an adjacent cell via a connector. For example, and referring now to FIGS. 4A and 4B, the first reception electrode 405 of the cell at $x_1,y_1$ is electrically coupled to the first reception electrode of the cell at $x_2,y_1$ by a first connector 450. Similarly, the second reception electrode 410 of the cell at $x_1,y_1$ is electrically coupled to the first reception electrode of the cell at $x_1,y_2$ by a second connector 455.

In various embodiments, each reception electrode 405, 410 may comprise various electrode portions, wherein some portions may have a larger surface area than another portion. For example, the first reception electrode 405 may comprise a first portion 415, a second portion 420, and a third portion 435. The first and second portions 415, 420 may have an area that is larger than an area of the third portion 435. The first and second portions 415, 420 may be electrically coupled via the third portion 435. Similarly, the second reception electrode 410 may comprise a first portion 425, a second portion 430, and a third portion 440. The first and second portions 425, 430 may be electrically coupled via the third portion 440.

The first and second portions 425, 430 of the second reception electrode 410 may be of substantially equal size and shape to that of the first reception electrode 405. For example, the first and second portions 425, 430 are each shown as a square shape connected by the third portion 440 shown as a long, thin, straight area connecting the adjacent corners of the first and second portions 425, 430. In various embodiments, the first and second portions 415, 425, 430, 420 are square-shaped, however, they may be any suitable shape and size. Similarly, in various embodiments, the third portions 435, 440 are straight line-like areas, however, they may be any suitable shape and size.

In various embodiments, each half (e.g., a top and bottom half, or a left and right half) of the cell 400 may comprise at least one portion of each reception electrode to ensure symmetry. For example, the top half of the cell comprises a portion of both the first and second reception electrodes 405, 410, while the bottom half comprises a portion of both first and second reception electrodes 405, 410. In other words, mirror images within the cell 400 may be formed along the first and second diagonals 465, 470.

The electrode arrangement of the touch sensor 100 may create a pattern of overlapping sensitivity regions 500 for increased sensitivity along an area between two adjacent cells, and to provide even distribution of sensitivity within each cell. For example, and referring to FIG. 5, the cell 400 at $x_1,y_1$ comprises at least a portion of four sensitivity regions 500. A first sensitivity region 500(1) corresponds to the electric field 125 between the drive electrode 110 and the first reception electrode 405, a second sensitivity region 500(2) corresponds to the electric field 125 between the drive electrode 110 and the second reception electrode 410, and third and fourth sensitivity regions 500(3), 500(4) correspond to the electric field 125 between the drive electrode and one reception electrode of one cell 400 and one reception electrode of an adjacent cell 400. As such, the sensitivity regions of each cell are distributed evenly across the cell. Further, the sensitivity regions may cover multiple cells resulting in detection in the areas between adjacent cells (e.g., along the x' and y' coordinates). The cells 400 may comprise any number of sensitivity regions 500 depending on the number of adjacent cells 400. For example, the cells 400 that are surrounded on all sides by other cells may comprise at least a portion of six sensitivity regions 500.

Figure 5:
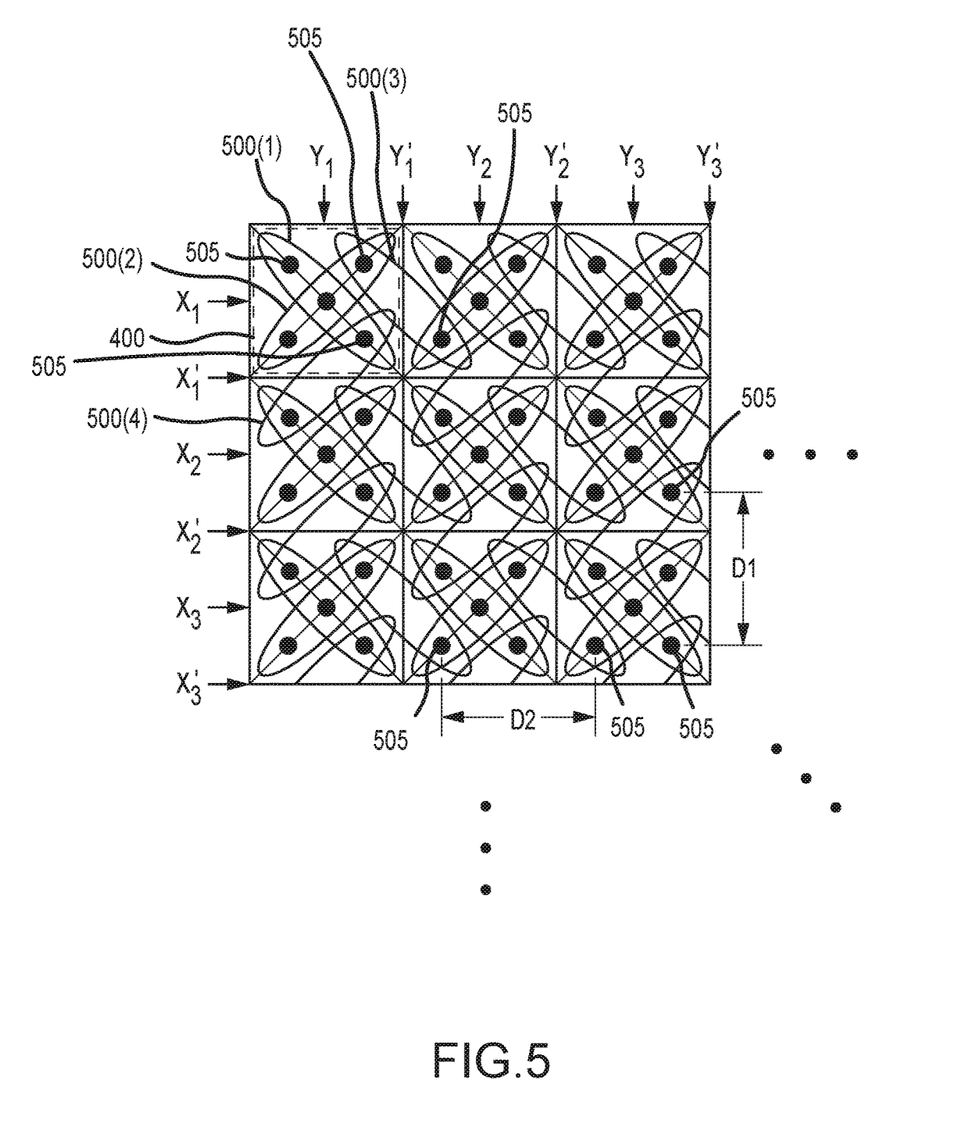
FIG. 5 representatively illustrates a sensitivity region of the touch sensor in accordance with an exemplary embodiment of the present technology.

Each sensitivity region 500 comprises a maximum sensitivity point 505 corresponding to the area where the electric field 125 is the strongest. The location of the maximum sensitivity point 505 may be based on the particular size and shape of the reception electrodes 405, 410 and the placement of the drive electrode 110. In the present embodiment, a center of the larger portions of each reception electrode 405, 410 will have the strongest electric field 125.

In various embodiments, for each electrode chain along one direction (e.g., the y-direction), a maximum sensitivity point in one cell to corresponding maximum sensitivity point in an adjacent cell may be separated by a first distance D1. For each electrode chain along a different direction (e.g., the x-direction), a maximum sensitivity point in one cell to corresponding maximum sensitivity point in an adjacent cell may be separated by a second distance D2. In an exemplary embodiment, the first distance D1 is substantially equal to the second distance D2.

Referring to FIGS. 1A-B and 4A-B, in operation, the touch sensor 100 detects the object 120 entering the electric field 125, indicating a "touch," by measuring changes in the capacitance of the capacitor formed by the reception electrode and the drive electrode. The touch sensor 100 may utilize the conversion circuit 215 (FIG. 2) to convert the change in capacitance to the digital value. The touch sensor 100 may transmit the digital output to the microprocessor 400. The microprocessor 400 may utilize the digital value to determine the coordinates of the touch.

In various embodiments, the microprocessor 400 monitors changes in capacitance by scanning the electrode chains 705, 605 row-by-row (e.g., channel A: channel δ) and column-by-column (e.g., channel 1: channel λ). Based on the values of the digital output for each electrode chain, the microprocessor 400 may determine the coordinate of the touch. For example, if channel 2 is activated (e.g., has a digital output value greater than the threshold value) and channel C is also activated, then the microprocessor may determine that the coordinate $x_3,y_2$ has been touched. Similarly, if channel 1, channel 2, and channel C are activated, then the microprocessor 400 may determine that the coordinate $x_3,y_1'$ has been touched.

The particular implementations shown and described are illustrative of the technology and its best mode and are not intended to otherwise limit the scope of the present technology in any way. Indeed, for the sake of brevity, conventional manufacturing, connection, preparation, and other functional aspects of the system may not be described in detail. Furthermore, the connecting lines shown in the various figures are intended to represent exemplary functional relationships and/or steps between the various elements. Many alternative or additional functional relationships or physical connections may be present in a practical system.

In the foregoing description, the technology has been described with reference to specific exemplary embodiments. Various modifications and changes may be made, however, without departing from the scope of the present technology as set forth. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any appropriate order and are not limited to the explicit order presented in the specific examples. Additionally, the components and/or elements recited in any system embodiment may be combined in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology.

The invention claimed is:

1. A mutual capacitance touch sensor, comprising:
   a plurality of cells arranged in rows and columns, each cell comprising:
   a first reception electrode, comprising a first portion electrically coupled to a second portion, wherein the first and second portions are positioned along a first diagonal direction within the cell; and
   a second reception electrode, comprising a first portion electrically coupled to a second portion, wherein the first and second portions are positioned along a second diagonal direction within the cell, wherein the second direction is perpendicular to the first direction; and
   a drive electrode positioned adjacent to the first reception electrode and the second reception electrode, and wherein the drive electrode forms a first capacitance with the first reception electrode and a second capacitance with the second reception electrode;
   wherein:
   a first set of cells forming a first column are electrically coupled together by the first reception electrode; and
   a second set of cells forming a first row are electrically coupled together by the second reception electrode.

2. The mutual capacitance touch sensor according to claim 1, wherein substantially one-half of the cell comprises at least one portion of each of the first and second reception electrodes.

3. The mutual capacitance touch sensor according to claim 1, wherein the first and second reception electrodes overlap at a center point of the cell.

4. The mutual capacitance touch sensor according to claim 1, wherein the drive electrode separates and surrounds each cell, and forms a grid pattern.

5. The mutual capacitance touch sensor according to claim 1, wherein:
   the first reception electrode is formed in a first substrate layer, and the second electrode is formed in a second substrate layer; and
   the first and second substrate layers are bonded together.

6. The mutual capacitance touch sensor according to claim 1, wherein each reception electrode has a plurality of maximum sensitivity points, and wherein the maximum sensitivity points are evenly distributed across the touch sensor.

7. The mutual capacitance touch sensor according to claim 1, wherein:

the first reception electrodes in the first column form a zigzag pattern along a first direction from a first edge of the touch sensor to an opposing second edge of the touch sensor; and the second reception electrodes in the first row form the zigzag pattern along a second direction, wherein the second direction is perpendicular to the first direction.

8. A method for forming a mutual capacitance touch sensor with improved sensitivity, comprising:

forming a plurality of first electrode chains in a first substrate layer in a first direction;
wherein forming a first electrode chain comprises forming a plurality of first reception electrodes and electrical interconnects in a zigzag pattern in the first direction;

forming a plurality of second electrode chains in a second substrate layer in a second direction;
wherein forming a second electrode chain comprises forming a plurality of second reception electrodes and electrical interconnects in the zigzag pattern in the second direction; and bonding a major surface of the first substrate layer to a major surface of the second substrate layer; and forming a drive electrode adjacent to the first electrode chain and the second electrode chain; wherein the drive electrode forms a first capacitance with the plurality of first reception electrodes and a second capacitance with the plurality of second reception electrodes.

9. The method for forming a mutual capacitance touch sensor according to claim 8, wherein forming the drive electrode comprises forming the drive electrode along an edge of at least one of the first and second substrate layers, and between each electrode chain.

10. The method for forming a mutual capacitance touch sensor according to claim 9, wherein the drive electrode forms a grid pattern, and the grid pattern defines individual cells.

11. The method for forming a mutual capacitance touch sensor according to claim 10, wherein each cell comprises:

a first reception electrode, comprising a first portion electrically coupled to a second portion, wherein the first and second portions are positioned along a first diagonal direction; and a second reception electrode, comprising a first portion electrically coupled to a second portion, wherein the first and second portions are positioned along a second diagonal direction.

12. The method for forming a mutual capacitance touch sensor according to claim 11, wherein each reception electrode comprises a plurality of maximum sensitivity points, and wherein the maximum sensitivity points are evenly distributed across each cell and between adjacent cells.

13. The method for forming a mutual capacitance touch sensor according to claim 8, wherein:

adjacent first electrode chains are arranged equidistant from each other; and adjacent second electrode chains are arranged equidistant from each other.

14. A mutual capacitance touch sensor system, comprising:

a plurality of cells arranged in an array to form a series of rows and columns, each cell comprising:

a first reception electrode, comprising a first portion electrically coupled to a second portion, wherein the first and second portions are positioned along a first diagonal direction;

a second reception electrode, comprising a first portion electrically coupled to a second portion, wherein the first and second portions are positioned along a second diagonal direction;

wherein:
the first reception electrodes of adjacent cells along a first column are coupled together to form a first electrode chain; and the second reception electrodes of adjacent cells along a first row are coupled together to form a second electrode chain;

a drive electrode comprising a first segment and a second segment arranged in a grid pattern, wherein the first segment forms a first capacitance with the first reception electrode and the second segment forms a second capacitance with the second reception electrode; and a microprocessor coupled to the electrode chains, wherein the microprocessor is responsive to a signal from each electrode chain to determine a touch coordinate.

15. The mutual capacitance touch sensor system according to claim 14, wherein the electrode chain is arranged in a zigzag pattern along one of an x-direction and a y-direction of the array.

16. The mutual capacitance touch sensor system according to claim 14, wherein the grid pattern defines a perimeter of each cell.

17. The mutual capacitance touch sensor system according to claim 14, wherein each reception electrode has a plurality of maximum sensitivity points, and wherein the maximum sensitivity points are evenly distributed across the cells.

18. The mutual capacitance touch sensor system according to claim 14, wherein the first and second reception electrodes of each cell overlap in a center point of the cell.

19. The mutual capacitance touch sensor system according to claim 14, wherein substantially one-half of each cell comprises at least one portion of each of the first and second reception electrodes.

20. The mutual capacitance touch sensor system according to claim 14, wherein the touch coordinate comprises at least one of:

a first coordinate corresponding to a cell within the array; and a second coordinate corresponding to a region between adjacent cells.

* * * * *